United States Patent
Sakurai (10) Patent No.: US 8,419,178 B2
(45) Date of Patent: Apr. 16, 2013

(54) INK-JET APPLICATION METHOD AND DISPLAY DEVICE PRODUCING METHOD

(75) Inventor: Naoaki Sakurai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/882,889

(22) Filed: Sep. 15, 2010

(65) Prior Publication Data

US 2011/0001784 A1    Jan. 6, 2011

Related U.S. Application Data

(62) Division of application No. 11/233,129, filed on Sep. 23, 2005, now abandoned.

(30) Foreign Application Priority Data

Sep. 24, 2004   (JP) ................................ 2004-278327

(51) Int. Cl.
*B41J 2/01*    (2006.01)
(52) U.S. Cl.
USPC .......................... 347/102; 347/101; 347/106
(58) Field of Classification Search .................. 347/102, 347/101, 106
See application file for complete search history.

(56) References Cited

U.S. PATENT DOCUMENTS

| | | | | |
|---|---|---|---|---|
| 4,833,488 A * | 5/1989 | Mizutani et al. | ............... | 347/205 |
| 5,521,125 A * | 5/1996 | Ormond et al. | ............... | 438/465 |
| 5,789,020 A | 8/1998 | Tran | | |
| 5,944,956 A * | 8/1999 | Marcheggiani | ............... | 162/199 |
| 6,074,962 A * | 6/2000 | Sakamoto et al. | ............ | 438/790 |
| 6,630,274 B1 * | 10/2003 | Kiguchi et al. | .................... | 430/7 |
| 6,868,885 B2 * | 3/2005 | Kakimoto et al. | ............ | 156/379 |
| 7,037,833 B2 * | 5/2006 | Hasei | ............................. | 438/674 |
| 7,223,309 B2 * | 5/2007 | Takahashi et al. | ............ | 118/712 |
| 7,419,255 B2 * | 9/2008 | Kawaguchi et al. | .......... | 347/102 |
| 2003/0183092 A1 * | 10/2003 | Barber et al. | .................... | 99/516 |
| 2004/0252170 A1 * | 12/2004 | Watanabe et al. | ............. | 347/100 |
| 2007/0048634 A1 * | 3/2007 | Denda et al. | ..................... | 430/7 |

FOREIGN PATENT DOCUMENTS

| | | |
|---|---|---|
| JP | 2003-266003 | 9/2003 |
| JP | 2003266003 A * | 9/2003 |
| TW | 565864 | 12/2003 |

* cited by examiner

*Primary Examiner* — Matthew Luu
*Assistant Examiner* — Henok Legesse
(74) *Attorney, Agent, or Firm* — Oblon, Spivak, McClelland, Maier & Neustadt, L.L.P.

(57) ABSTRACT

By using an ink-jet application method, a solid content having a desired thickness contained in an application solution is formed in a desired region of a substrate by repeating an applying process and a drying process more than once. In the applying process, the application solution is sprayed and applied on the substrate. In the drying process, the application solution is dried to generate the solid content.

5 Claims, 6 Drawing Sheets

INK-JET APPLICATION METHOD AND DISPLAY DEVICE PRODUCING METHOD

CROSS REFERENCE TO RELATED APPLICATIONS

This application is a division of and claims the benefit of priority under 35 U.S.C. §120 from U.S. Ser. No. 11/233,129 filed Sep. 23, 2005, and claims benefit of priority under 35 U.S.C §119 from Japanese Patent Application No. 2004-278327 filed Sep. 24, 2004, the entire contents of each of which are incorporated by reference herein.

BACKGROUND OF THE INVENTION

1. Field of the Invention

The present invention relates to an ink-jet application method employed in a process for producing a display, a biochip, etc. and a display device producing method to which the ink-jet application method is employed. More specifically, the present invention relates to an ink-jet application method employed in a process for applying an application solution on a substrate to be incorporated into a product such as a semiconductor device, a liquid crystal display panel, an organic EL (electroluminescence) display panel, a field emission display panel, etc. and a display device producing method to which the ink-jet application method is employed.

2. Description of the Related Art

In a process for producing a display, a biochip, etc., a film (e.g. functional layer) is formed on a substrate to be incorporated into a product such as a semiconductor device, a liquid crystal display panel, an organic EL (electroluminescence) display panel, a field emission display panel, etc. by spraying drops of an application solution containing a water solution, an inorganic solvent or an organic solvent from a ink-jet nozzle and then applying the application solution on the substrate. This ink-jet application method is mainly employed in a process for forming the film (e.g. process for forming a luminous layer or a color filter layer of a display). The process requires a fine patterning.

A conventional ink-jet application method is disclosed in Japanese Unexamined Patent Publication No. 2003-266003. In the method, in order to restrict a spread of an application solution applied on a substrate within a prescribed range and control a shape of a film formed from the application solution, the following preprocessing is carried out: (1) an ink-attracting process is carried out in a region where the application solution is to be applied; (2) an ink-shedding process is carried out in a region where the application solution is to be not applied; (3) a bank (structural barrier) is formed around a region where the application solution is to be applied.

Especially, the bank is in heavy usage at a time of forming a thick film. In a case where a film or a patterning is formed on a block surrounded by the bank, after one or a plurality of drops of an application solution is sprayed from an ink-jet nozzle and applied on the block, a solid content (film) of the application solution is generated on the block by drying the application solution with a hot plate, an air-spray, a vacuum processing, etc.

However, in the case where the application solution is applied on the substrate on which the bank is formed by using the conventional ink-jet application method, a volume of the application solution is restricted to prevent the application solution from escaping from the block surrounded by the bank. Therefore, a thickness of the solid content of the application solution is far smaller than a height of the bank.

In order to increase the thickness of the solid content, it is cited to increase a concentration of solute (the solid content) included in the application solution. However, in a case where the application solution is applied by using the ink-jet nozzle, the concentration cannot be increased without restriction because an application solution property is adjusted to surface tension and flow resistance which allow the application solution to be easily sprayed from the ink-jet nozzle.

In order to increase the thickness of the solid content, it is cited to increase the height of the bank. However, the height cannot be increased without restriction in view of a structure of the device into which the substrate is incorporated because a film and a layer are usually formed on the bank in a post-process.

In order to increase the thickness of the solid content, it is cited to carry out the ink-shedding process on an upper surface of the bank and spray the application solution in the block surrounded by the bank as much as possible. However, a volume of the application solution cannot be increased without restriction because the sprayed application solution escapes from the block into adjacent blocks.

SUMMARY OF THE INVENTION

An object of the present invention is to provide an ink-jet application method that is capable of easily forming a film having a desired thickness without generating an uneven application at a time of applying an application solution on a substrate by using an ink-jet, and a display device producing method to which the ink-jet application method is employed.

In order to achieve the above object, the present invention provides an ink-jet application method comprising steps of: spraying and applying drops of an application solution on a substrate; and drying the applied application solution to generate a solid content contained in the application solution, wherein the solid content having a desired thickness is formed in a desired region of the substrate by repeating the applying step and the drying step more than once.

According to the present invention, since the applying process and the drying process are repeated more than once, the thickness of the solid content increases in comparison with the conventional ink-jet application method. Also, in a case where the solid content having a desired thickness is formed, since a volume of ink to be applied in each applying process can be reduced in comparison with the conventional ink-jet application method, a film is easily formed.

In order to achieve the above object, the present invention provides an ink-jet application method comprising steps of: spraying and applying drops of an application solution in a block surrounded by a bank formed on a substrate; and drying the applied application solution to generate a solid content contained in the application solution, wherein the solid content having a desired thickness is formed in the block by repeating the applying step and the drying step more than once.

According to the present invention, since the applying process and the drying process are repeated more than once, the thickness of the solid content increases in comparison with the conventional ink-jet application method. Also, in a case where the solid content having a desired thickness is formed, since a volume of ink to be applied in each applying process can be reduced in comparison with the conventional ink-jet application method, a film is easily formed.

In order to achieve the above object, the present invention provides a display device producing method comprising steps of: spraying and applying drops of an application solution on a substrate; and drying the applied application solution to generate a light shield film, wherein the light shield film having a desired thickness is formed in a desired region of the substrate by repeating the applying step and the drying step more than once.

According to the present invention, since the applying process and the drying process are repeated more than once, the thickness of the light shield film increases in comparison with the conventional display device producing method. Also, in a case where the light shield film having a desired thickness is formed, since a volume of ink to be applied in each applying process can be reduced in comparison with the conventional display device producing method, the light shield film is easily formed.

In order to achieve the above object, the present invention provides a display device producing method comprising steps of: spraying and applying drops of an application solution in a block surrounded by a bank formed on a substrate; and drying the applied application solution to generate a light shield film, wherein the light shield film having a desired thickness is formed in the block by repeating the applying step and the drying step more than once.

According to the present invention, since the applying process and the drying process are repeated more than once, the thickness of the light shield film increases in comparison with the conventional display device producing method. Also, in a case where the light shield film having a desired thickness is formed, since a volume of ink to be applied in each applying process can be reduced in comparison with the conventional display device producing method, the light shield film is easily formed.

DESCRIPTION OF THE PREFERRED EMBODIMENT

In reference with FIGS. 1 to 6, a first and second embodiments of the present invention will be described. Here, an X-axis, a Y-axis and a Z-axis are defined as a longitudinal direction, a width direction and a height direction of an ink-jet application device, respectively. The X-axis, the Y-axis and the Z-axis are orthogonal to one another.

First Embodiment

Figure 1:
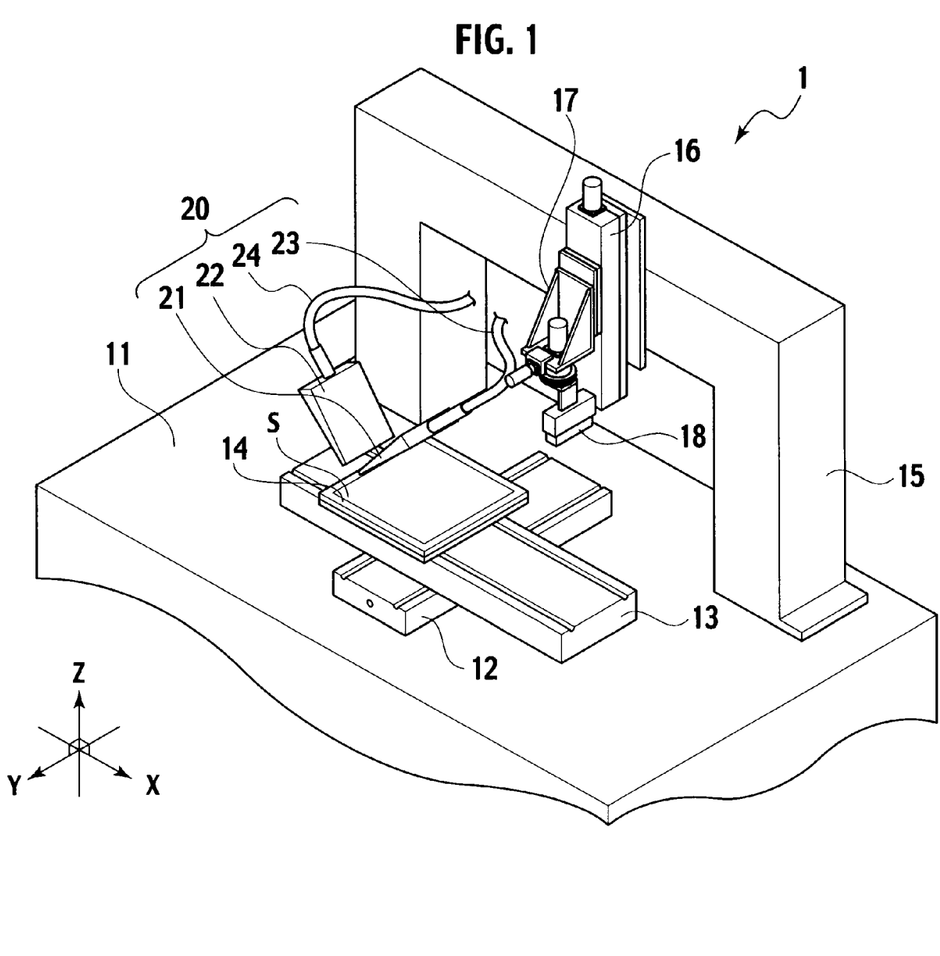
FIG. 1 is a perspective view of an ink-jet application device according to a first embodiment of the present invention.

As shown in FIG. 1, an ink-jet application device 1 comprises a mounting 11, a Y-axis table 12, an X-axis table 13, a stage 14, a supporting body 15, a lifting member 16, a supporting tool 17, an ink-jet head 18 and an air-knife unit 20.

The Y-axis table 12 is fixed on the upper surface of the mounting 11. The X-axis table 13 is placed on an upper surface of the Y-axis table 12. The Y-axis table 12 moves the X-axis table 13 in the Y-axis direction on the basis of an order from a controller (not shown). The stage 14 is placed on an upper surface of the X-axis table 13. The X-axis table 13 moves the stage 14 in the X-axis direction on the basis of an order from the controller.

Figure 2:
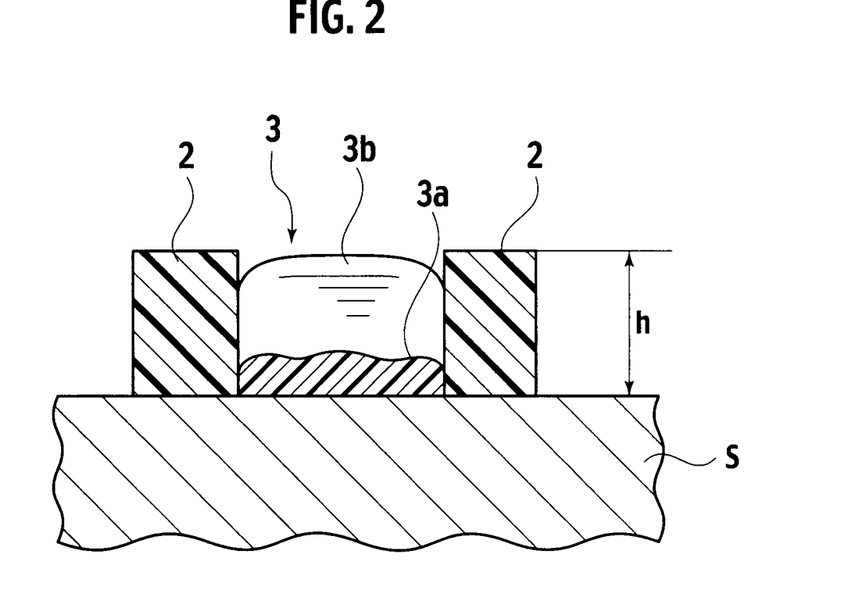
FIG. 2 is an enlarged cross-sectional view in the vicinity of a substrate in a state of applying an application solution on the substrate by using the ink-jet application device according to the first embodiment of the present invention.

A substrate S is placed on an upper surface of the stage 14. As shown in FIG. 2, a plurality of banks 2 are arranged on a surface of the substrate S in a standing manner. The banks 2 are made of a polyimide and have upper surfaces on which an ink-shedding process is carried out. It is noted that a light shielding layer may be formed in a part of the banks 2 or all banks 2 in order to employ the banks 2 as a black matrix of a color filter.

The supporting body 15 is substantially inverted U-shaped and arranged on the upper surface of the mounting 11 in a standing manner so as to stride over the Y-axis table 12, the X-axis table 13, the stage 14 and the substrate S. The lifting member 16 is movably mounted on a side surface (+Y side) of an upper portion of the supporting body 15. The supporting tool 17 is substantially L-shaped and mounted on a side surface (+Y side) of the lifting member 16. The ink-jet head 18 is rotatably mounted on a lower portion of the supporting tool 17 and extends down the lower portion. The ink-jet head 18 has a rotational axis which is in parallel to the Z-axis. An atmosphere suited to an ink application is maintained in the vicinity of the ink-jet head 18.

The air-knife unit 20 is a drying means and comprises a discharge air-knife nozzle 21, a suction air-knife nozzle 22, a discharge pipe 23 and a suction pipe 24. The air-knife unit 20 is located away from the ink-jet head 18.

The discharge air-knife nozzle 21 is attached to a supporting unit (not shown) mounted on the mounting 11. The discharge air-knife nozzle 21 can move in a plane which is substantially in parallel to the upper surface of the mounting 11. Similarly, the suction air-knife nozzle 22 is attached to the supporting unit mounted on the mounting 11. The suction air-knife nozzle 22 can move in a plane which is substantially in parallel to the upper surface of the mounting 11. A nozzle orifice of the discharge air-knife nozzle 21 is located adjacent to a nozzle orifice of the suction air-knife nozzle 22.

The discharge pipe 23 has one end connected to a blower (not shown) and the other end connected to the discharge air-knife nozzle 21. The suction pipe 24 has one end connected to a pump (not shown) and the other end connected to the suction air-knife nozzle 22.

Figure 3:
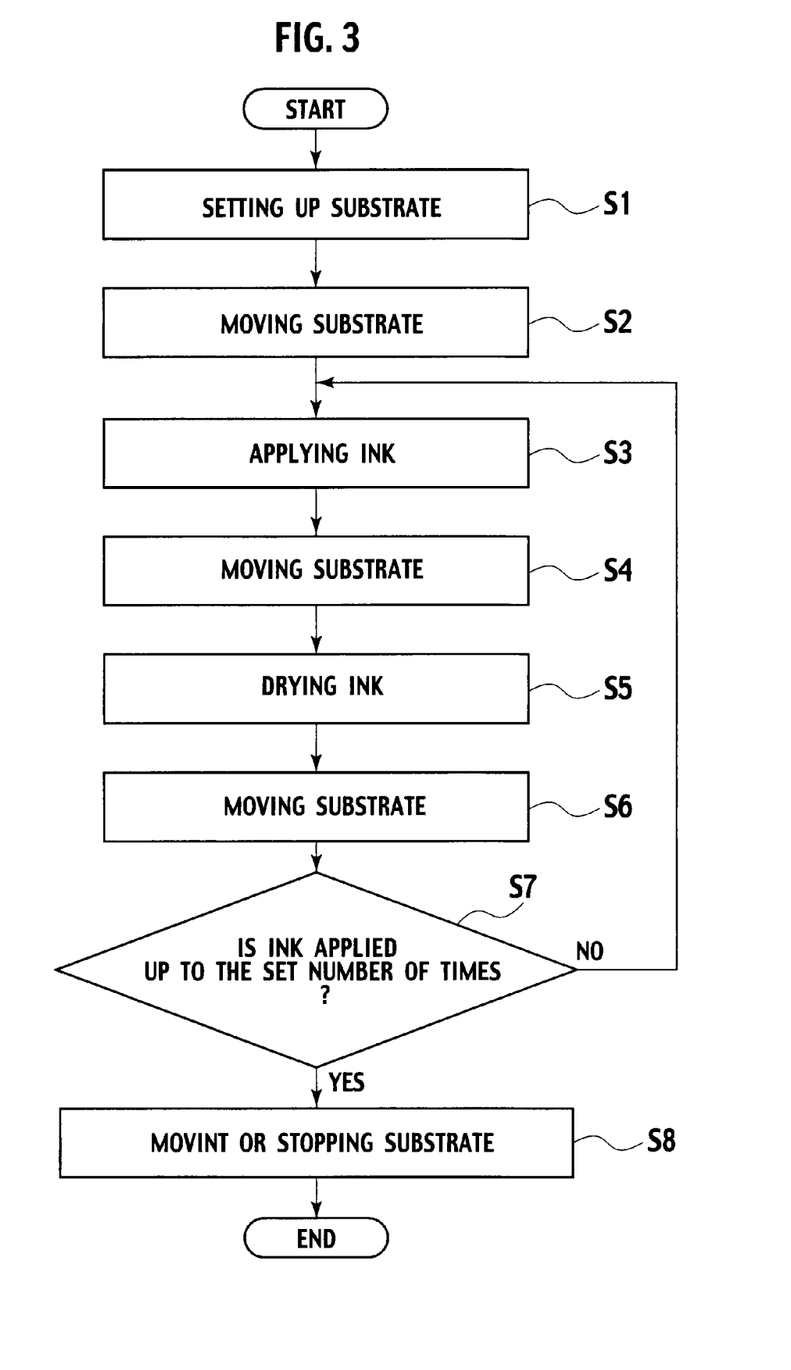
FIG. 3 is a flowchart of an ink-jet application method by using the ink-jet application device according to the first embodiment of the present invention.

Next, in the surface of the substrate S, a method for forming a solid content (film) of an application solution (ink) on a block surrounded by the bank 2 by using the ink-jet application device 1 will be described (see FIG. 3).

Firstly, the substrate S is placed on the upper surface of the stage 14 (step S1), and is located below the ink-jet head 18 by moving the Y-axis table 12 and the X-axis table 13 on the basis of an order from the controller (step S2). Next, the ink-jet head 18 applies ink on a block surrounded by the bank 2 formed on the surface of the substrate S (step S3). Then, the substrate S is located below the air-knife unit 20 by moving the Y-axis table 12 and the X-axis table 13 on the basis of an order from the controller (step S4). In a state of moving the nozzle orifices of the discharge air-knife nozzle 21 and the suction air-knife nozzle 22 closer to the substrate S, airflow is locally generated above the block by discharging air from the nozzle orifice of the discharge air-knife nozzle 21 and suctioning the air into the nozzle orifice of the suction air-knife nozzle 22. The applied ink is dried by the airflow and then a solid content 3a of the ink is formed on the block (step S5).

After drying, the substrate S is located below the ink-jet head 18 again by moving the Y-axis table 12 and the X-axis table 13 on the basis of an order from the controller (step S6). Here, the controller determines whether or not ink is applied on the block up to the set number of times (step S7). If ink is applied on the block up to the set number of times, another block adjacent to the block is located below the ink-jet head 18 by moving the Y-axis table 12 and the X-axis table 13, or movement of the Y-axis table 12 and the X-axis table 13 is stopped (step S8). If ink is not applied on the block up to the set number of times, the flow returns to the step S3. In the second or later ink application process, the ink-jet head 18 applies ink on the block from above the solid content 3a.

Thus, a film (several layers of the solid content) 3 having a desired thickness is obtained by repeating the applying process and the drying process up to the set number of times (more than once) in the block. It is noted that the film 3 may be a color film or a black matrix film when the substrate 3 is a color filter substrate of a display device.

The ink-jet application method has the following advantages.

In a case where the film 3 having a desired thickness is formed on the block surrounded by the bank 2 in the surface of the substrate S, the applying process and the drying process are repeated up to the set number of times (more than once), after forming the solid content (solute) 3a contained in the ink in concentrations of about 20-30% by volatilizing and evaporating a solvent contained in the ink in concentrations of about 70-80% in the first applying process and drying process. Therefore, the thickness of the film 3 increases in comparison with the conventional ink-jet application method for carrying out an applying process and drying process only once.

In a case where the film having a desired thickness is formed, since a volume of ink to be applied in each applying process can be reduced in comparison with the conventional ink-jet application method, the ink is prevented from escaping from the bank 2.

In a case where the thin film is formed, since a volume of ink to be applied in each applying process can be reduced in comparison with the conventional ink-jet application method, a height of the bank 2 can be reduced. This leads to improve a flatness of the substrate.

The film can be stably formed because a desired portion of the ink is dried by using the Y-axis table 12, the X-axis table 13, the discharge air-knife nozzle 21 and the suction air-knife nozzle 22.

It is not necessary to completely solidify the solute contained in the ink in the drying process except the final drying process. Namely, it is only necessary to volatilize the solvent contained in the ink to fully reduce volume of the ink. Therefore, the drying time required in each drying process can be shortened in comparison with the conventional ink-jet application method, and heating temperature required in each drying process can be reduced.

In a case of forming a film having a thickness that is equal to or more than 1 μm, this ink-jet application method is advantage.

It is noted that a film thickness, a film shape, a solute concentration and a bank height may be arbitrarily changed according to the number of repeating the applying process and the drying process.

The drying is not limited to the air blasting by the air-knife unit. It may use a heating by a hot plate, a vacuuming by a decompressor, etc.

Figure 4:
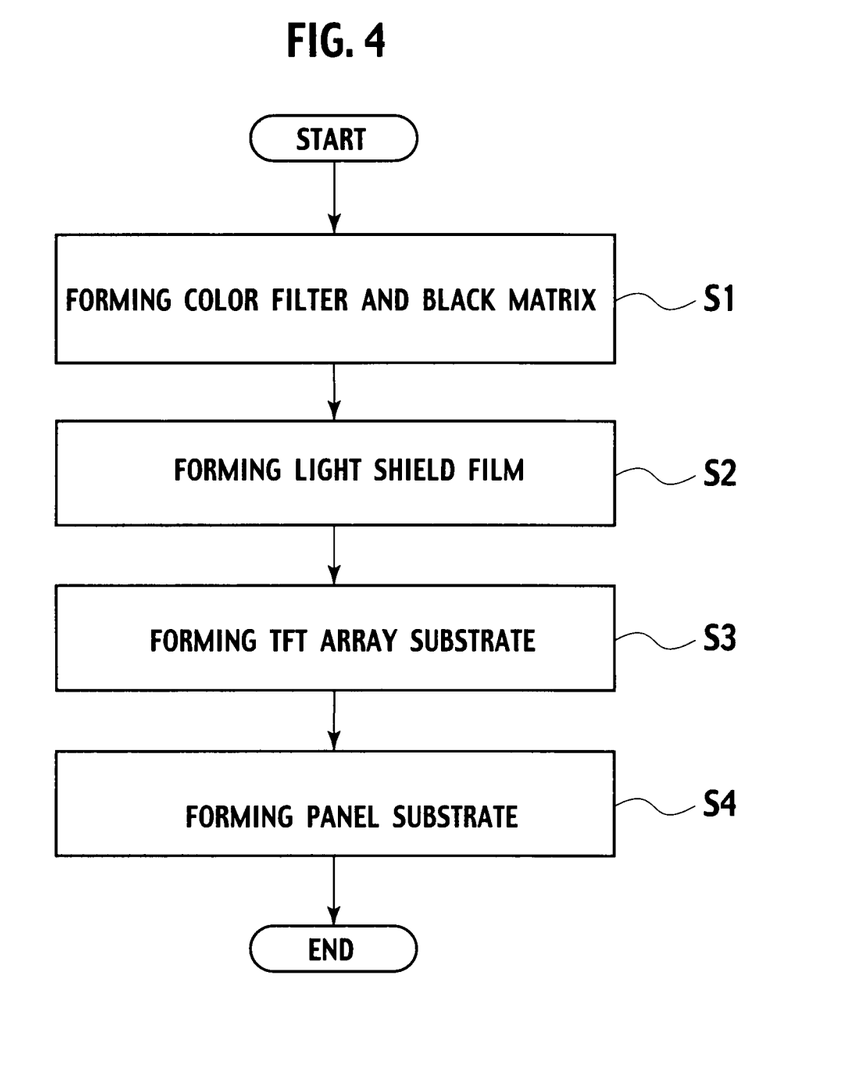
FIG. 4 is a flowchart of a display device producing method of the present invention.

Next, a method for producing a display device (liquid crystal display) by means of the ink-jet application method will be described (see FIG. 4).

First, a color filter and a black matrix are formed on one glass substrate (step S1). Secondly, a color filter substrate is produced by forming a light shielding film in a non-display region located around a display region, in which luminescent spots (sub-pixels) of the color filter layer are formed, or a region between the luminescent spots to shield light in the non-display region or the region between the luminescent spots (step S2). Thirdly, a thin-film transistor (TFT) is regularly arranged on the other glass substrate to produce a TFT array substrate (step S3). Finally, a panel substrate is produced by pasting the color filter substrate and the TFT array substrate together and then injecting a liquid crystal material into a clearance between the color filter substrate and the TFT array substrate (step S4). It is noted that the color filter and the black matrix may be on the other glass substrate at the time of producing the TFT array substrate as well as the steps S2 and S3.

Since the light shielding film has a thickness that is equal to or more than 1 μm, this ink-jet application method is suitable for forming the light shielding film. The ink-jet application method may be employed to not only forming the light shield film but also applying a color resist in a process for producing the color filter.

Experiment

In a process for producing a color filter substrate, after a black resist film (black matrix) is formed on a substrate, a plurality of banks are formed by selectively removing one part of the black resist film on the substrate by means of a PEP (photo-engraving-process) method. A block surrounded by one bank has 3 μm in height and 150 μm angle.

A green color resist having solute concentrations of 20% is applied on the block by means of the conventional ink-jet application method. More specifically, six drops (total volumes 120 pl) of the color resist having volumes of 20 pl per one drop is applied on the block. The color resist semi-circularly rises by surface tension above an upper portion of the bank. When such operation is carried out in 10000 blocks on the substrate, the color resist escapes from 32 blocks. Then, a solid content of the color resist has 1.5 μm in thickness by heating the substrate with a hot plate in 150° C. and then drying the heated color resist.

Also, in the above-described experiment, when the color resist is applied on 10000 blocks on the substrate after a CF4/O2 plasma process (ink-shedding process) is carried out on the upper portions of the banks, the color resist escapes form 4 blocks.

Next, a green color resist having solute concentrations of 20% is applied on the block by means of the ink-jet application method according to the present invention. More specifically, three drops (total volumes 60 pl) of the color resist having volumes of 20 pl per one drop is applied on the block in the first applying process. Then, after the substrate is heated with a hot plate in 150° C. and then the heated color resist is dried in the drying process, three drops of the color resist is applied on the blocks from above a solid content of the color resist in the second applying process. When such operation is carried out in 10000 blocks on the substrate, there is not a block from which the color resist escapes without carrying out the ink-shedding process on the upper portions of the banks.

Second Embodiment

Figure 5:
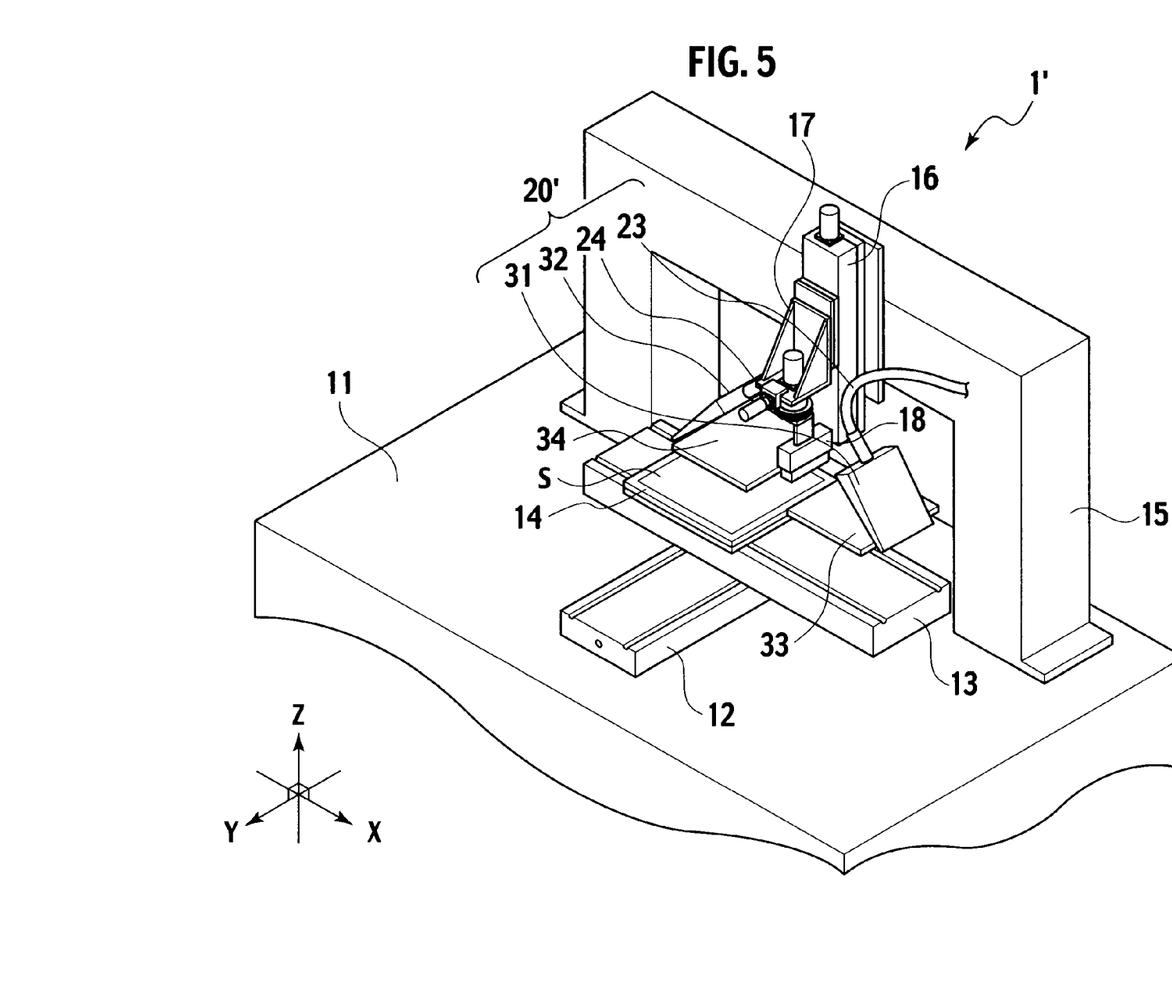
FIG. 5 is a perspective view of an ink-jet application device according to a second embodiment of the present invention.

As shown in FIG. 5, an ink-jet application device 1' comprises a mounting 11, a Y-axis table 12, an X-axis table 13, a stage 14, a supporting body 15, a lifting member 16, a supporting tool 17, an ink-jet head 18, an air-knife unit 20' and shield plates 33, 34.

The Y-axis table 12 is fixed on an upper surface of the mounting 11. The X-axis table 13 is placed on an upper surface of the Y-axis table 12. The Y-axis table 12 moves the X-axis table 13 in the Y-axis direction on the basis of an order from a controller (not shown). The stage 14 is placed on an upper surface of the X-axis table 13. The X-axis table 13 moves the stage 14 in the X-axis direction on the basis of an order from the controller.

A substrate S is placed on an upper surface of the stage 14. As shown in FIG. 2, a plurality of banks 2 are arranged on a surface of the substrate S in a standing manner. The banks 2 are made of a polyimide and have upper surfaces on which an ink-shedding process is carried out. It is noted that a light shielding layer may be formed in a part of the banks 2 or all banks 2 in order to employ the banks 2 as a black matrix of a color filter.

The supporting body 15 is substantially inverted U-shaped and arranged on the upper surface of the mounting 11 in a standing manner so as to stride over the Y-axis table 12, the X-axis table 13, the stage 14 and the substrate S. The lifting member 16 is movably mounted on a side surface (+Y side) of an upper portion of the supporting body 15. The supporting tool 17 is substantially L-shaped and mounted on a side surface (+Y side) of the lifting member 16. The ink-jet head 18 is rotatably mounted on a lower portion of the supporting tool 17 and extends down the lower portion. The ink-jet head 18 has a rotational axis which is in parallel to the Z-axis. An atmosphere suited to an ink application is maintained in the vicinity of the ink-jet head 18.

The air-knife unit 20' is a drying means and comprises pipes 23, 24 and air-knife nozzles 31, 32. The air-knife unit 20' is located in the vicinity of the ink-jet head 18.

The air-knife nozzle 31 is attached to a supporting unit (not shown) mounted on the mounting 11 or the supporting body 15 so as to locate in a +X side of the ink-jet head 18. The air-knife nozzle 31 can move in a plane which is substantially in parallel to the upper surface of the mounting 11. A nozzle orifice of the air-knife nozzle 31 is formed in a tapered shape and is away from the ink-jet head 18 as moving downward (that is the nozzle orifice extends in the +X direction as moving in the −Z direction). Similarly, the air-knife nozzle 32 is attached to the supporting unit mounted on the mounting 11 or the supporting body 15 so as to locate in a −X side of the ink-jet head 18. The air-knife nozzle 32 can move in a plane which is substantially in parallel to the upper surface of the mounting 11. A nozzle orifice of the air-knife nozzle 32 is formed in a tapered shape and is away from the ink-jet head 18 as moving downward (that is the nozzle orifice extends in the −X direction as moving in the −Z direction).

The pipe 23 has one end connected to a blower (not shown) and the other end connected to the air-knife nozzle 31. Similarly, the pipe 24 has one end connected to the blower and the other end connected to the air-knife nozzle 32. When air is supplied to the air-knife nozzles 31, 32 through the pipes 23, 24, the air is discharged from the nozzle orifices of the air-knife nozzles 31, 32 to generate airflow above the substrate S. The generated airflow dries ink applied on the substrate S. It is noted that air may be suctioned from the nozzle orifices of the air-knife nozzles 31, 32 by using an air displacement pump instead of the blower to generate airflow above the substrate S.

The shield plate 33 is placed between the ink-jet head 18 and the air-knife nozzle 31. Similarly, the shield plate 34 is placed between the ink-jet head 18 and the air-knife nozzle 32. The shield plates 33, 34 are supported by a moving unit (not shown) mounted on the mounting 11 or the supporting body 15 so as to move independent of the air-knife nozzles. The shield plates 33, 34 prevents ink applied on the substrate S from drying until the ink is located in the vicinity of the nozzle orifice of the air-knife nozzle 31 or 32.

Figure 6:
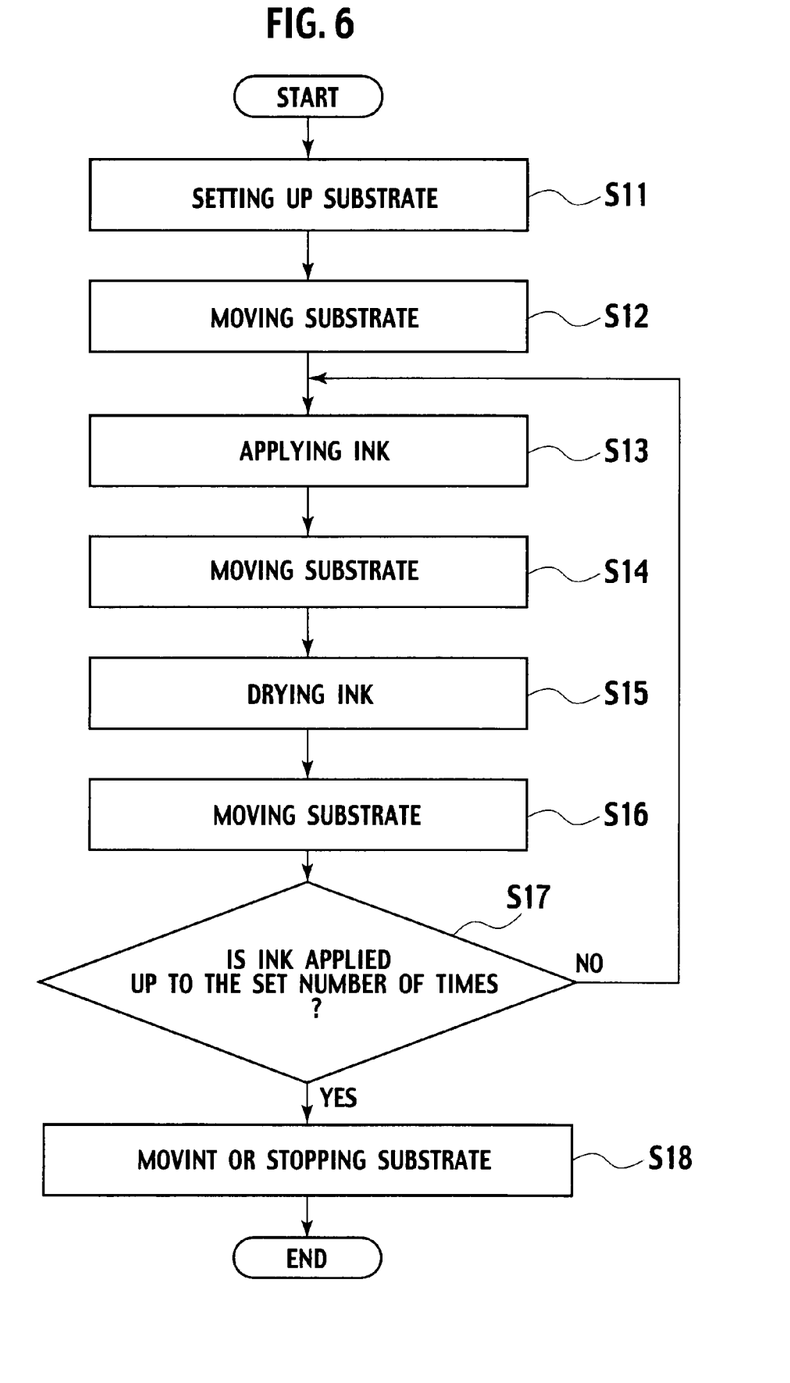
FIG. 6 is a flowchart of an ink-jet application method by using the ink-jet application device according to the second embodiment of the present invention.

Next, in the surface of the substrate S, a method for forming a solid content (film) of an application solution (ink) on a block surrounded by the bank 2 by using the ink-jet application device 1' will be described (see FIG. 6).

Firstly, the substrate S is placed on the upper surface of the stage 14 (step S11), and is located below the ink-jet head 18 by moving the Y-axis table 12 and the X-axis table 13 on the basis of an order from the controller (step S12). Next, the ink-jet head 18 applies ink on a block surrounded by the bank 2 formed on the surface of the substrate S (step S13). Then, the substrate S is located below the air-knife unit 20' (air-knife nozzle 31 or 32) by moving the X-axis table 13 on the basis of an order from the controller (step S14). In a state of moving the nozzle orifice of the air-knife nozzle 31 or 32 closer to the substrate S, airflow is locally generated above the block by discharging air from the nozzle orifices of the air-knife nozzles 31, 32 (or suctioning air from the nozzle orifices of the air-knife nozzles 31, 32). The applied ink is dried by the airflow and then a solid content 3a of the ink is formed on the block (step S15).

After drying, the substrate S is located below the ink-jet head 18 again by moving the X-axis table 13 on the basis of an order from the controller (step S16). Here, the controller determines whether or not ink is applied on the block up to the set number of times (step S17). If ink is applied on the block up to the set number of times, another block adjacent to the block is located below the ink-jet head 18 by moving the Y-axis table 12 and the X-axis table 13, or movement of the Y-axis table 12 and the X-axis table 13 is stopped (step S18). If ink is not applied on the block up to the set number of times, the flow returns to the step S13. In the second or later ink application process, the ink-jet head 18 applies ink on the block from above the solid content 3a.

Thus, a film (several layers of the solid content) 3 having a desired thickness is obtained by repeating the applying process and the drying process up to the set number of times (more than once) in the block.

The ink-jet application method has the following advantages in addition to the advantages of the ink-jet application method using the ink-jet application device 1.

Since the air-knife nozzles 31, 32 are located in both sides (±X sides) of the ink-jet head 18, a time when the substrate S is moved by using the Y-axis table 12 and the X-axis table 13 can be shortened. This shortens a time required in an ink-jet application method.

Since the shield plates 33, 34 are located between the ink-jet head 18 and the air-knife nozzles 31, 32, an atmosphere suited to apply ink on the substrate S is maintained in the vicinity of the ink-jet head 18. This prevents ink applied on the substrate S from drying beyond necessity.

What is claimed is:

1. An ink-jet application method comprising steps of:
spraying and applying drops of an application solution in a block defining a volume surrounded by walls of a bank formed on a substrate; and
drying the applied application solution to generate a solid content contained in the application solution,
wherein the solid content having a desired thickness is formed in the block within the bank by repeating the applying step and the drying step more than once in the block without changing a height of the bank, in each applying step after a first applying step, drops of the same application solution as that applied in the first applying step are applied in the block on the whole surface of the solid content generated in the prior drying step, wherein in a final drying step, the solvent contained in the applied application solution is completely volatilized, and in each drying step other than the final drying step, the solvent contained in the applied application solution is not completely volatilized.

2. The ink-jet application method according to claim 1, wherein an air-knife nozzle dries the application solution in each drying step, and airflow is locally limited to a region where the application solution is applied and in the vicinity of the region, by discharging air from a discharge air knife nozzle and suctioning the air into a suction air knife nozzle.

3. The ink-jet application method according to claim 1, wherein the applying step and the drying step are repeated until the thickness of the solid content become to be equal to or more than 1 μm.

4. The ink-jet application method according to claim 1, wherein the bank has an upper end surface in which an ink-shedding process is carried out.

5. The ink-jet application method according to claim 1, wherein the solid content is contained in the application solution in concentrations of 20-30%.

* * * * *